United States Patent
Schumann

(10) Patent No.: US 7,800,399 B1
(45) Date of Patent: Sep. 21, 2010

(54) VIRTUAL REGULATOR FOR CONTROLLING A TERMINATION VOLTAGE IN A TERMINATION CIRCUIT

(75) Inventor: Reinhard Schumann, Exeter, NH (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 12/462,581

(22) Filed: Aug. 4, 2009

(51) Int. Cl.
    *H03K 19/003* (2006.01)
(52) U.S. Cl. .......................................... 326/30; 326/27
(58) Field of Classification Search .................. 326/30, 326/21, 26–27
    See application file for complete search history.

(56) References Cited

U.S. PATENT DOCUMENTS 5,729,152 A * 3/1998 Leung et al. .................. 326/21
7,375,545 B2 * 5/2008 Kubo ........................... 326/30
7,692,445 B2 * 4/2010 Muraoka et al. ............... 326/27

* cited by examiner

*Primary Examiner*—James Cho
(74) *Attorney, Agent, or Firm*—Farajami & Farajami LLP.

(57) ABSTRACT

According to one exemplary embodiment, a termination circuit includes a number of drivers configured to receive source data on an input bus and to drive an output bus including a number of output lines. In the termination circuit the output lines are terminated by resistors, where one resistor is coupled between each output line and a common capacitor node. The termination circuit further includes a virtual regulator at the drivers, configured to control a termination voltage at the capacitor node by inputting compensation data into the drivers during idle cycles to achieve a net average 50% duty cycle. The virtual regulator can determine which cycles are idle by detecting an idle code in the source data.

19 Claims, 4 Drawing Sheets

VIRTUAL REGULATOR FOR CONTROLLING A TERMINATION VOLTAGE IN A TERMINATION CIRCUIT

BACKGROUND OF THE INVENTION

1. Field of the Invention

The present invention is generally in the field of electrical circuits. More particularly, the invention is in the field of termination circuits.

2. Background Art

A termination circuit, such as a communications termination circuit or a memory termination circuit, typically provides a termination resistance to a common node, so as to prevent degradation of signal integrity on communications lines. Sometimes the common node is not at ground potential. Sometimes the common node voltage is at a potential half way between ground and a power supply voltage, and the required termination voltage is regulated in some manner. For example, a memory termination circuit, such as a double data rate (DDR) dynamic random access memory (DRAM) termination circuit can be required to provide a termination voltage approximately equal to one-half of a supply voltage, such as VDD, at the regulated voltage node. However, conventional termination circuits, such as conventional DDR DRAM termination circuits, suffer from various disadvantages.

In one conventional termination circuit, a plurality of communication lines are each driven by a driver and coupled to a regulated voltage node by a termination resistor and also coupled to a load. The regulated voltage node is coupled to a ground through a capacitor and also coupled to a termination voltage regulator, which is a special regulator that can source and sink current. Although the termination voltage regulator can provide a precise termination voltage at the regulated voltage node, the termination voltage regulator is a separate component that can undesirably increase manufacturing cost.

In another conventional termination circuit, a plurality of communication lines are each driven by a driver and each terminated with two resistors. Each communication line is coupled to a supply voltage, such as VDD, by one termination resistor and coupled to a ground by another termination resistor. The two termination resistors can, as a pair, provide a Thevenin-equivalent termination voltage of VDD/2. However, the additional termination resistor required at each regulated voltage node can undesirably increase manufacturing cost. Also, the conventional termination circuit can draw DC power through the termination resistors, which undesirably increases power consumption.

SUMMARY OF THE INVENTION

A virtual regulator for controlling a termination voltage in a termination circuit is provided. Features, advantages and various embodiments of the present invention are shown in and/or described in connection with at least one of the drawings, as set forth more completely in the claims.

DETAILED DESCRIPTION OF THE INVENTION

The present invention is directed to a virtual regulator for controlling a termination voltage in a termination circuit. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1:
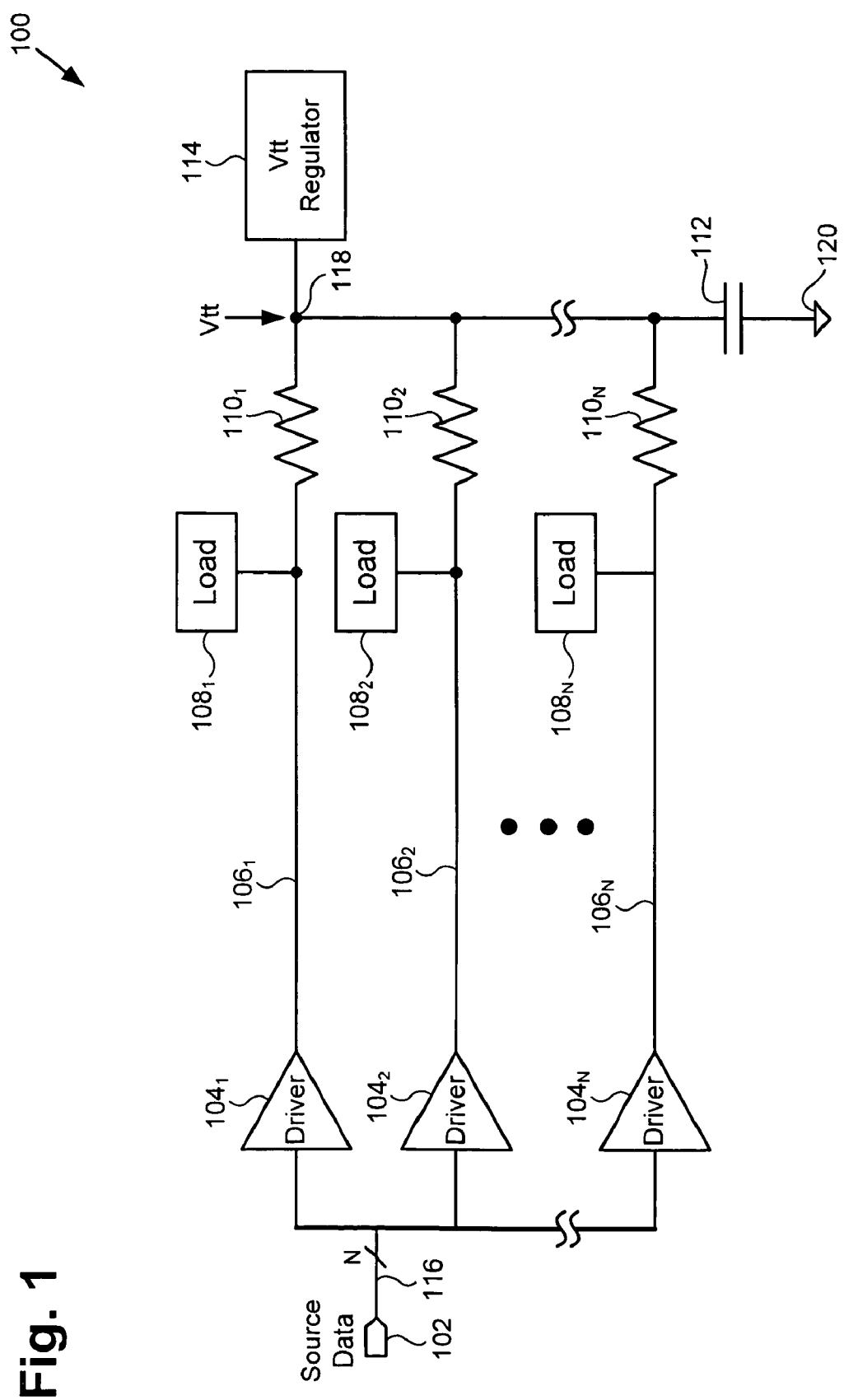
FIG. 1 illustrates a circuit diagram of an exemplary conventional termination circuit.

FIG. 1 shows a circuit diagram of an exemplary conventional termination circuit. Conventional termination circuit 100 includes source data 102, drivers $104_1, 104_2, \ldots, 104_N$, lines $106_1, 106_2, \ldots, 106_N$, loads $108_1, 108_2, \ldots, 108_N$, termination resistors $110_1, 110_2, \ldots, 110_N$, capacitor 112, termination voltage (Vtt) regulator 114, and bus 116. Conventional termination circuit 100 can generally be a communications termination circuit. For memory applications, conventional circuit 100 can be a memory termination circuit, such as a DDR DRAM memory termination circuit.

As shown in FIG. 1, source data 102, which is a digital signal, is coupled to the inputs of drivers $104_1, 104_2, \ldots, 104_N$, via bus 116, which can be an N-bit bus. For example, source data 102 can comprise "N" bits of digital data, where each bit of data can be inputted into one of drivers $104_1, 104_2, \ldots, 104_N$. For DDR DRAM termination, source data 102 can include address/control data. Also shown in FIG. 1, lines $106_1, 106_2, \ldots, 106_N$ are coupled between the outputs of drivers $104_1, 104_2, \ldots, 104_N$ and first terminals of termination resistors $110_1, 110_2, \ldots, 110_N$, and second terminals of termination resistors $110_1, 110_2, \ldots, 110_N$ are coupled to Vtt (termination voltage) regulator 114 and a first terminal of capacitor 112 (e.g. a filter capacitor) at node 118, respectively. Lines $106_1, 106_2, \ldots, 106_N$ can be communication lines, which can be, for example, address/control lines in a DDR DRAM application. Vtt regulator 114 can be, for example, a linear regulator that is capable of sourcing or sinking current. Vtt regulator 114 can provide a termination voltage (Vtt) at node 118, which is a regulated voltage node.

Further shown in FIG. 1, a second terminal of capacitor 112 is coupled to ground 120 and loads $108_1, 108_2, \ldots, 108_N$ are coupled to respective lines $106_1, 106_2, \ldots, 106_N$ and the first terminals of termination resistors $110_1, 110_2, \ldots, 110_N$. Loads $108_1, 108_2, \ldots, 108_N$ can each be, for example, the inputs of a memory chip, such as a DDR DRAM. In conventional termination circuit 100, such as a conventional communications termination circuit, Vtt regulator 114 can set Vtt at node 118 for the termination of each of lines $106_1, 106_2, \ldots, 106_N$. For DDR DRAM, the specifications typically require that the resistive termination be terminated to a voltage that is the approximate mid-point between the supply voltage (i.e. VDD) and ground. Thus, for DDR DRAM, Vtt regulator 114 can provide a termination voltage (Vtt) that is approximately equal to VDD/2 at node 118. The values of termination resistors $110_1, 110_2, \ldots, 110_N$ can be selected to match the characteristic impedance of respective lines $106_1$, $106_2, \ldots, 106_N$, which can be formed on a circuit board. For example, if lines $106_1, 106_2, \ldots, 106_N$ each have a characteristic impedance of approximately 50.0 ohms, termination resistors $110_1, 110_2, \ldots, 110_N$ can each have a resistance of approximately 50.0 ohms.

By utilizing Vtt regulator 114, conventional termination circuit 100 can provide a desired termination voltage at node 118. However, the disadvantages of conventional termination circuit 100 are the cost of Vtt regulator 114, which is a special regulator that can either sink or source current, and the circuit board space it occupies.

Figure 2:
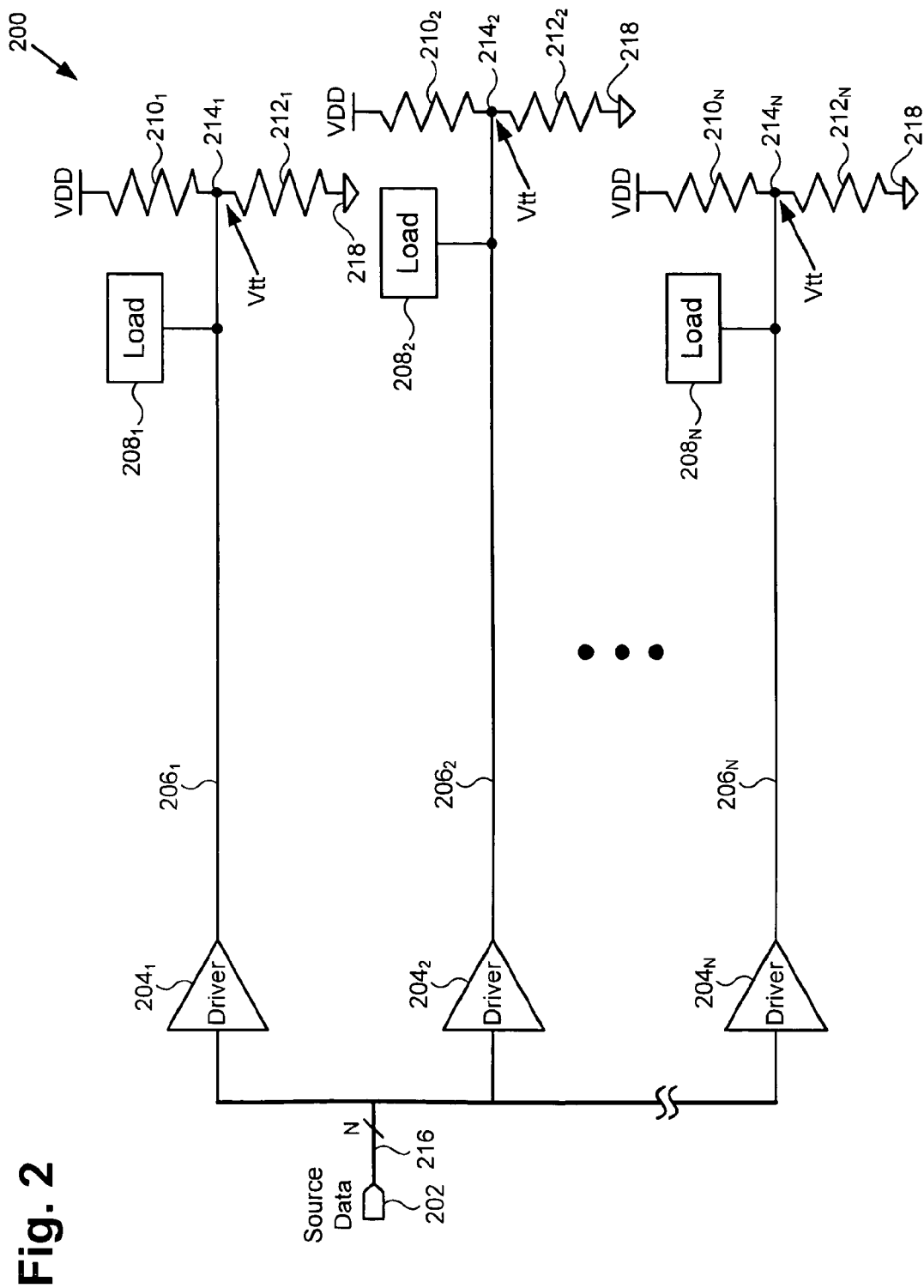
FIG. 2 illustrates a circuit diagram of another exemplary conventional termination circuit.

FIG. 2 shows a circuit diagram of another exemplary conventional termination circuit. Conventional termination circuit 200 includes source data 202, drivers $204_1, 204_2, \ldots, 204_N$, lines $206_1, 206_2, \ldots, 206_N$, loads $208_1, 208_2, \ldots, 208_N$, termination resistors $210_1, 210_2, \ldots, 210_N$ and $212_1, 212_2, \ldots, 212_N$, and bus 216. In conventional termination circuit 200, source data 202, drivers $204_1, 204_2, \ldots, 204_N$, lines $206_1, 206_2, \ldots, 206_N$, loads $208_1, 208_2, \ldots, 208_N$, and bus 216 correspond, respectively, to source data 102, drivers $104_1, 104_2, \ldots, 104_N$, lines $106_1, 106_2, \ldots, 106_N$, loads $108_1, 108_2, \ldots, 108_N$, and bus 116 in conventional termination circuit 100 in FIG. 1. Similar to conventional termination circuit 100, conventional termination circuit 200 can also generally be a communications termination circuit. For memory applications, conventional circuit 200 can be a memory termination circuit, such as a DDR DRAM termination circuit.

As shown in FIG. 2, lines $206_1, 206_2, \ldots, 206_N$ are coupled between the outputs of drivers $204_1, 204_2, \ldots, 204_N$ and first terminals of termination resistors $210_1, 210_2, \ldots, 210_N$ and first terminals of termination resistors $212_1, 212_2, \ldots, 212_N$ at nodes $214_1, 214_2, \ldots, 214_N$, respectively. Also shown in FIG. 2, second terminals of termination resistors $210_1, 210_2, \ldots, 210_N$ are coupled to VDD and second terminals of termination resistors $210_1, 210_2, \ldots, 210_N$ are coupled to ground 218. In conventional termination circuit 200, respective lines $206_1, 206_2, \ldots, 206_N$ are terminated to VDD via termination resistors $210_1, 210_2, \ldots, 210_N$ and terminated to ground 216 via termination resistors $212_1, 212_2, \ldots, 212_N$. By coupling termination resistors $210_1, 210_2, \ldots, 210_N$ and termination resistors $212_1, 212_2, \ldots, 212_N$ between VDD and ground 218, a Thevenin equivalent termination voltage (Vtt) can be provided at nodes $214_1, 214_2, \ldots, 214_N$ for respective lines $206_1, 206_2, \ldots, 206_N$, such as communication lines.

In conventional termination circuit 200, the values of termination resistors $210_1, 210_2, \ldots, 210_N$ and termination resistors $212_1, 212_2, \ldots, 212_N$ can be appropriately selected to set a desired termination voltage (Vtt) for lines $206_1, 206_2, \ldots, 206_N$ at respective nodes $214_1, 214_2, \ldots, 214_N$. Thus, for DDR DRAM, the values of termination resistors $210_1, 210_2, \ldots, 210_N$ and termination resistors $212_1, 212_2, \ldots, 212_N$ can be selected so as to provide a required termination voltage that is approximately equal to VDD/2 for lines $206_1, 206_2, \ldots, 206_N$ at respective nodes $214_1, 214_2, \ldots, 214_N$. Also, the values of termination resistors $210_1, 210_2, \ldots, 210_N$ and termination resistors $212_1, 212_2, \ldots, 212_N$ can be selected to match the characteristic impedance of respective lines $206_1, 206_2, \ldots, 206_N$, which can be formed on a circuit board. For example, if lines $206_1, 206_2, \ldots, 206_N$ each have a characteristic impedance of approximately 50.0 ohms, termination resistors $210_1, 210_2, \ldots, 210_N$ and termination resistors $212_1, 212_2, \ldots, 212_N$ can each have a resistance of approximately 100.0 ohms, resulting in a Thevenin equivalent termination impedance of 50.0 Ohms and a Thevenin equivalent termination voltage of VDD/2.

However, conventional termination circuit 200 requires two termination resistors for each line, which undesirably increases component count and, consequently, manufacturing cost. Also, conventional termination circuit 200 draws DC power through the termination resistors, even when the drivers $204_1, 204_2, \ldots, 204_N$ are not enabled, which undesirably increases power consumption.

Figure 3:
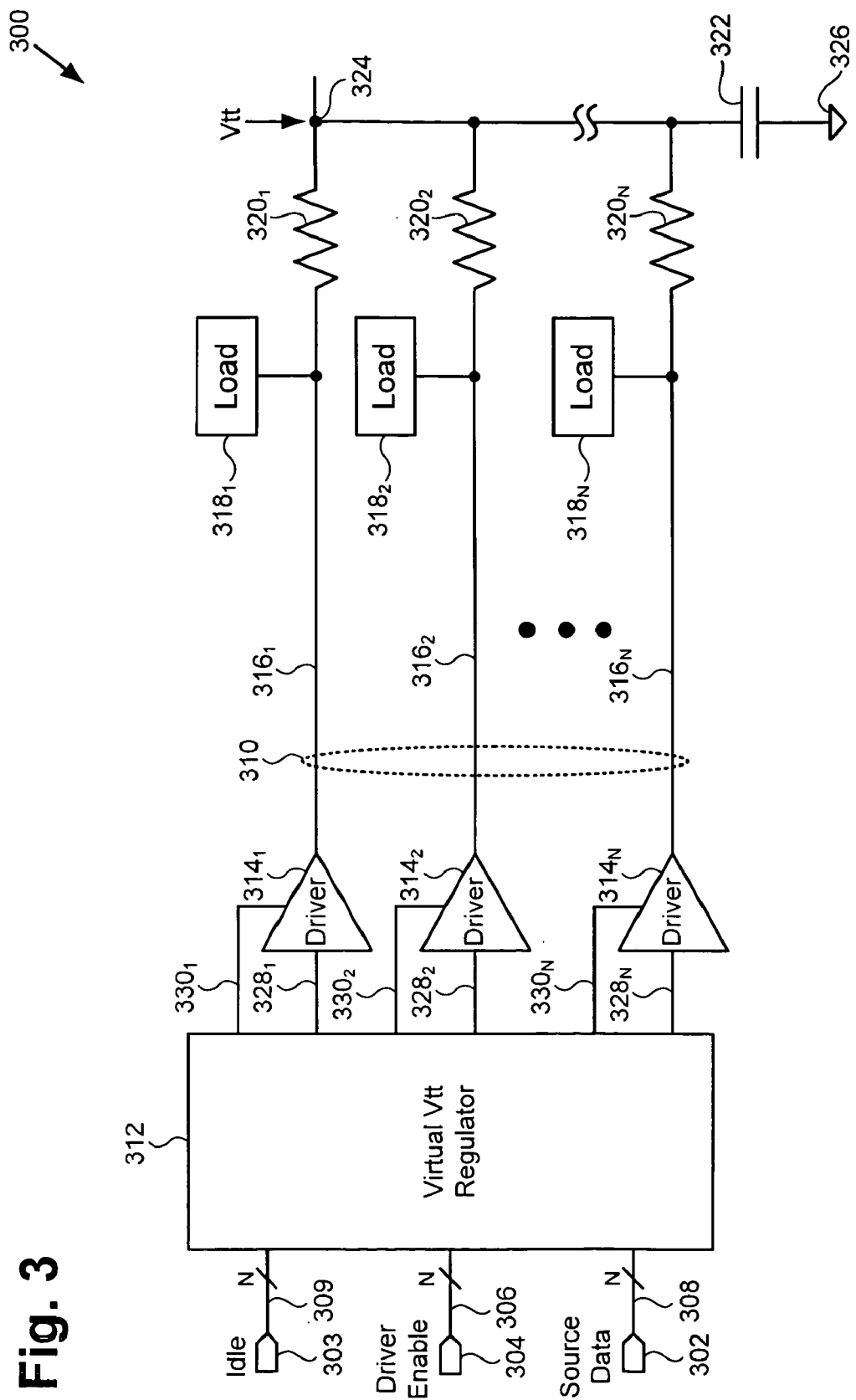
FIG. 3 illustrates a circuit diagram of an exemplary termination circuit in accordance with one embodiment of the present invention.

FIG. 3 shows a circuit diagram of an exemplary termination circuit in accordance with one embodiment of the present invention. In FIG. 3, termination circuit 300 includes source data 302, driver enable 304, buses 306, 308, and 310, virtual termination voltage regulator 312 (also referred to simply as "virtual regulator 312"), drivers $314_1, 314_2, \ldots, 314_N$, lines $316_1, 316_2, \ldots, 316_N$, loads $318_1, 318_2, \ldots, 318_N$, termination resistors $320_1, 320_2, \ldots, 320_N$, and capacitor 322. Termination circuit 300 can be, for example, a communications termination circuit or a memory termination circuit, such as a DDR DRAM termination circuit.

As shown in FIG. 3, source data 302, which is a digital signal, is coupled to virtual regulator 312 via bus 308, which can be an N-bit bus. For example, source data 302 can comprise "N" bits of digital data, where each bit of data can be inputted into one of drivers $314_1, 314_2, \ldots, 314_N$ via virtual regulator 312. For example, "N" can be equal to 24 in one embodiment of the invention. For DDR DRAM termination, source data 302 can include address/control data. Bus 308, which is a parallel-line bus, can include address lines and control lines, such as write enable (WE), column address select (CAS), and row address select (RAS) control lines. Source data 302 can comprise "N" bits of digital data, where each bit of data can be inputted on one of lines $328_1, 328_2, \ldots, 328_N$ so as to control a corresponding one of drivers $314_1, 314_2, \ldots, 314_N$.

Also shown in FIG. 3, driver enable 304, which is a digital signal, is coupled to virtual regulator 312 via bus 306, which can be an N-bit bus. Driver enable 304 can comprise "N" bits of digital enable data, where each bit of enable data can be inputted on one of lines $330_1, 330_2, \ldots, 330_N$ so as to enable a corresponding one of drivers $314_1, 314_2, \ldots, 314_N$. For DDR DRAM, data on lines $328_1, 328_2, \ldots, 328_N$ can include address and control data. Further shown in FIG. 3, idle signal 303 (also referred to as "idle data 303" or simply as "idle 303"), which is a digital signal, is coupled to virtual regulator 312 via bus 309, which can be an N-bit bus. Idle signal 303 can comprise "N" bits of digital idle data.

Also shown in FIG. 3, the outputs of drivers $314_1, 314_2, \ldots, 314_N$ are coupled to loads $318_1, 318_2, \ldots, 318_N$ and first terminals of termination resistors $320_1, 320_2, \ldots, 320_N$ via lines $316_1, 316_2, \ldots, 316_N$, respectively. Lines $316_1, 316_2, \ldots, 316_N$ can be communication lines and are situated in bus 310, which is also referred to as an "output bus" in the present application. Lines $316_1, 316_2, \ldots, 316_N$ correspond, respectively, to lines $328_1, 328_2, \ldots, 328_N$. In one embodiment, loads $318_1, 318_2, \ldots, 318_N$ can each comprise, for example, one or more inputs on memory chips, such as on one or more DDR DRAM chips, which can be coupled to respective lines $316_1, 316_2, \ldots, 316_N$. For example, load $318_1$ can comprise one or more inputs on one or more DDR DRAM chips, where each DDR DRAM chip can be coupled to line $316_1$. The values of termination resistors $320_1, 320_2, \ldots, 320_N$ can be selected to match the characteristic impedance of respective lines $316_1, 316_2, 316_N$, which can be formed on a circuit board. For example, if lines $316_1, 316_2, \ldots, 316_N$ each have a characteristic impedance of approximately 50.0 ohms, termination resistors $320_1, 320_2, \ldots, 320_N$ can each have a resistance of approximately 50.0 ohms.

Further shown in FIG. 3, second terminals of termination resistors $320_1, 320_2, \ldots, 320_N$ are coupled to a first terminal of capacitor 322 at capacitor node 324, and a second terminal of capacitor 322 is coupled to ground 326. In one embodiment, the second terminal of capacitor 322 can be coupled to a negative or positive supply voltage. In another embodiment, capacitor 322 may be replaced by multiple capacitors each of whose second terminals are coupled to ground or to a supply voltage. Capacitor node 324 can provide a termination voltage for each of lines $316_1, 316_2, \ldots, 316_N$, where the termination voltage is controlled by virtual regulator 312. DDR DRAM specifications typically require that a resistive line termination be terminated to a voltage (i.e. a termination voltage) that is at an approximate mid-point between the supply voltage (VDD) and ground. Thus, for DDR DRAM, virtual regulator 312 can provide a termination voltage that is approximately equal to the supply voltage (i.e. VDD) divided by two (i.e. approximately equal to 50.0 percent of VDD) at capacitor node 324 for each of lines $316_1, 316_2, \ldots, 316_N$. Capacitor 322 can be a filter capacitor and can have a value of, for example, approximately 5.0 microfarads (µF) in one embodiment of the invention.

In termination circuit 300, virtual regulator 312 can be configured to control a termination voltage at capacitor node 324 by inputting compensation data into drivers $314_1, 314_2, \ldots, 314_N$ in place of source data 302 during one or more "idle cycles" on bus 308 when a difference between a logic "0's" count and a logic "1's" on the input bus (i.e. on lines $328_1, 328_2, \ldots, 328_N$) exceeds a threshold value. In the present application, an "idle cycle" refers to a period of time during which buses, such as buses 308 and 310, are not active, or are driving "no operation" commands. The existence of an idle cycle can be determined by observing the current data pattern and the prior sequence of data patterns on buses 306, 308, and 309. Thus, during an idle cycle, the source data 302 that would be driven on bus 310 by drivers $314_1, 314_2, \ldots, 314_N$ is not important and a different "no operation" command (referred to as "compensation data") can be sent on bus 310 by buses 330 and 328 and by drivers $314_1, 314_2, \ldots, 314_N$ in its place. For example, if some of the bits of source data 302 are command bits, and some are address bits, the compensation data can include command bits that form a "no operation" command, and address bits that are chosen arbitrarily. The bits of the compensation data can include an appropriate number of logic "0" values (also referred to simply as "logic 0's" in the present application) and/or logic "1" values (also referred to simply as "logic 1's" in the present application) so as to incrementally increase or decrease the termination voltage at capacitor node 324 for each of lines $316_1, 316_2, \ldots, 316_N$. For example, if the compensation data contains more "logic 1's" than "logic 0's", then the termination voltage will typically be increased. Similarly, if the compensation data contains more "logic 0's" than "logic 1's", then the termination voltage will typically be decreased.

For DDR DRAM, virtual regulator 312 can provide a termination voltage equal to approximately VDD/2 at capacitor node 324 by providing appropriate compensation data on lines $316_1, 316_2, \ldots, 316_N$ during one or more idle cycles on bus 310 so as to ensure that the combined total number of number of logic "0's" is approximately equal to the combined total number of logic "1's" on lines $316_1, 316_2, \ldots, 316_N$ over a large number of clock cycles. The number of logic "0's" does not have to balance the number of logic "1's" on any one of lines $316_1, 316_2, \ldots, 316_N$ because the termination currents through all termination resistors $320_1, 320_2, \ldots, 320_N$ are combined at capacitor node 324, which is connected to capacitor 322.

Virtual regulator 312 can be further configured to determine an error value corresponding to the cumulative difference between a digital "0's" count and a digital "1's" count on the output bus 328, compare the error value to a positive threshold value and/or to a negative threshold, and to provide compensation data over lines $328_1, 328_2, \ldots, 328_N$ during one or more idle cycles whenever the error value is above the positive threshold value or below the negative threshold value. For example, when the error value indicates a greater number of digital "0's" compared to digital "1's", the compensation data can include more digital "1's" so as to restore a balance between digital "1's" and digital "0's" on lines $316_1, 316_2, \ldots, 316_N$, and similarly the compensation data can include more digital "0's" when the error value indicates a greater number of digital "1's" compared to digital "0's". In one embodiment of the invention, a positive error value can indicate a greater number of digital "1's" than digital "0's" and a negative error value can indicate a greater number of digital "0's" than digital "1's" on lines $316_1, 316_2, \ldots, 316_N$.

Virtual regulator 312 can be further configured to detect an idle cycle on bus 308 by detecting an idle code in source data 302 and/or idle data 303. The idle code can include, for example, one or more bits of source data 302. The logic value of one or more signals on bus 308 can be utilized to indicate an idle cycle. For DDR DRAM, an idle cycle can be indicated, for example, when write enable (WE), column address select (CAS), and row address select (RAS) signals are each in a high state (i.e. a logic "1"). In one embodiment, the logic value of a chip select signal can be utilized to indicate an idle cycle for DDR DRAM. For example, an idle cycle can be indicated when the chip select signal is at a logic "1". In another embodiment, the logic value of a clock enable signal can be utilized to indicate an idle cycle for DDR DRAM. For example, an idle cycle can be indicated when the clock enable signal, which can optionally be part of idle data 303 rather than source data 302, is at a logic "0".

In one embodiment, in which RAS, CAS, and WE are used as the idle code, the idle code is included in the compensation data that is provided on lines $316_1, 316_2, \ldots, 316_N$ of bus 310 by virtual regulator 312 during one or more idle cycles to control the termination voltage at capacitor node 324. In another embodiment in which the chip select signal is utilized to detect an idle cycle for DDR DRAM, the three lines that are utilized for write enable, column address select, and row address select signals can be available to virtual regulator 312 for sending compensation data on bus 310.

If the capacitance value of capacitor 322 is sufficiently large, the termination voltage (Vtt) at capacitor node 324, after many cycles have elapsed, can be represented approximately by the equation:

$$Vtt = VDD \cdot (\Sigma line\ 316_1 + \Sigma line\ 316_2 + \Sigma line\ 316_N)/N \quad \text{equation (1)}$$

where "N" is the number of lines in bus 310. For DDR DRAM, a termination voltage approximately equal to VDD/2 can be provided at capacitor node 324 by driving an approximately equal number of logic "1's" and logic "0's" on lines $316_1, 316_2, \ldots, 316_N$ over a sufficiently long time period. Only an overall balance of logic "1's" and logic "0's" on the combination of all of lines $316_1, 316_2, \ldots, 316_N$ is required—not a balance of logic "1's" and logic "0's" on any particular line. In equation (1), the integration of each of lines $316_1, 316_2, \ldots, 316_N$, such as communication lines, can occur over any desired number of clock cycles. To set the termination voltage equal to VDD/2, lines $316_1, 316_2, \ldots, 316_N$ can be driven such that the sum of the integrals of each line divided by "N" is equal to 0.5. The termination voltage achieved by the virtual regulator is approximate, since a sequence of unbalanced non-idle cycles may immediately cause the termination voltage to deviate slightly from any previously achieved voltage accuracy. The deviation from the desired termination voltage may be higher if few idle cycles are available, or if the duration between idle cycles is long. In order to guarantee a certain maximum deviation, it may be necessary to require a minimum percentage of idle cycles and/or a maximum duration between idle cycles.

By utilizing virtual regulator 312 to provide a termination voltage for a plurality of lines, such as address/control lines, at capacitor node 324, an embodiment of the invention's termination circuit 300 can provide the termination voltage at a reduced manufacturing cost compared to conventional termination circuits, such as conventional termination circuit 100 in FIG. 1 and conventional termination circuit 200 in FIG. 2. An embodiment of the invention's virtual regulator will be further discussed in relation to FIG. 4.

Figure 4:
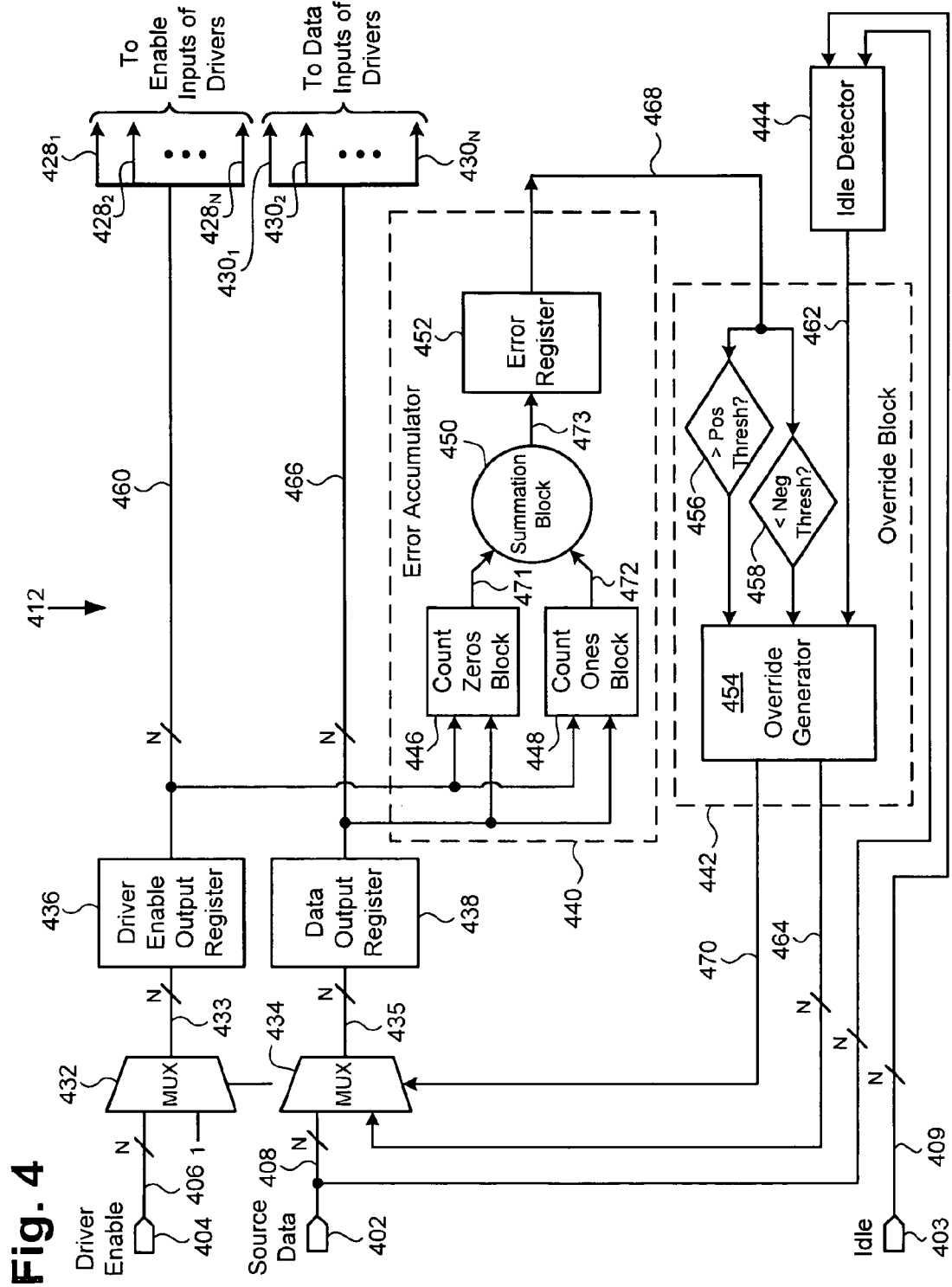
FIG. 4 illustrates a block diagram of an exemplary virtual termination voltage regulator in accordance with one embodiment of the present invention.

FIG. 4 shows a block diagram of an exemplary virtual regulator in accordance with one embodiment of the present invention. In FIG. 4, source data 402, drive enable 404, idle 403, buses 406, 408, and 409, virtual regulator 412, lines $428_1$, $428_2$, ..., $428_N$, and lines $430_1$, $430_2$, ..., $430_N$ correspond, respectively, to source data 302, drive enable 304, idle 303, buses 306, 308 and 309, virtual regulator 312, lines $328_1$, $328_2$, ..., $328_N$, and lines $330_1$, $330_2$, ..., $330_N$ in termination circuit 300 in FIG. 3. Virtual regulator 412 includes multiplexers (MUXes) 432 and 434, driver enable output register 436, data output register 438, error accumulator 440, override block 442, and idle detector 444. Error accumulator 440 includes count zeros block 446, count ones block 448, summation block 450, and error register 452, and override block 442 includes override generator 454 and decision blocks 456 and 458. It is noted that bus 466 and bus 310 (shown in FIG. 3) include the same data. Thus, lines $330_1$, $330_2$, ..., $330_N$ of bus 310 correspond, respectively, to lines $316_1$, $316_2$, ..., $316_N$ of bus 310.

As shown in FIG. 4, driver enable 404 is coupled to a data input of MUX 432 via bus 406, a bus of logic "1"s is coupled to another data input of MUX 432, and an output of MUX 432 is coupled to an input of driver enable output register 436 via bus 433. Also shown in FIG. 4, an output of driver enable output register 436 is coupled to enable inputs of drivers $314_1$, $314_2$, ..., $314_N$ (shown in FIG. 3) via bus 460 and also coupled to respective inputs of count zeros block 446 and count ones block 448 in error accumulator 440. Bus 460 includes lines $428_1$, $428_2$, ..., $428_N$, which are coupled to the respective enable inputs of drivers $314_1$, $314_2$, ..., $314_N$ (shown in FIG. 3).

In one embodiment, the output of driver enable output register 436 is not coupled to the respective inputs of count zeros block 446 and count ones block 448. In this embodiment, the virtual termination circuit can only be used when the outputs are continuously enabled. In this embodiment, MUX 432 is not needed, and driver enable output register 436 may not be needed, and/or the driver enable lines $428_1$, $428_2$, ..., $428_N$ may be permanently tied to the active state.

Further shown in FIG. 4, source data 402 is coupled to a data input of MUX 434 via bus 408 and coupled to an input of idle detector 444, another data input of MUX 434 is coupled to an output of override generator 454 via bus 464, and an output of MUX 434 is coupled to data output register 438 via bus 435. Also shown in FIG. 4, the output of data output register 438 is coupled to the data inputs of drivers $314_1$, $314_2$, ..., $314_N$ (shown in FIG. 3) via bus 466 (i.e. an input bus) and also coupled to respective inputs of count zeros block 446 and count ones block 448 in error accumulator 440. Bus 466 includes lines $430_1$, $430_2$, ..., $430_N$, which are coupled to the respective data inputs of drivers $314_1$, $314_2$, ..., $314_N$ (shown in FIG. 3). Idle detector 444 can be configured to monitor source data 402 and idle data 403 for idle cycles on bus 408 and bus 409 respectively, and to notify override generator 454 via an idle detection signal on line 462 when an idle cycle is detected. Idle detector 444 can detect an idle cycle on bus 408, for example, by detecting an idle code in source data 402. Alternatively, idle detector 444 can detect an idle cycle by detecting inactive clock enable, for example, in idle data 403.

Also shown in FIG. 4, the outputs of count zeros block 446 and count ones block 448 are coupled to respective inputs of summation block 450, error register 452 is coupled to an input of summation block 450, an output of summation block 450 is coupled to an input of error register 452 and also coupled to respective inputs of decision blocks 456 and 458 in override block 462 via line 468. Further shown in FIG. 4, respective outputs of decision blocks 456 and 458 are coupled to the inputs of override generator 454 and an output of override generator 454 is coupled to a select input of MUX 434 via line 470.

Count zeros block 446 can be configured to determine a count of all of the active logic "0"s on each of lines $430_1$, $430_2$, ..., $430_N$ of bus 466 during each clock cycle and to provide the logic "0"s count to summation block 450 via bus 471. Similarly, count ones block 448 can be configured to determine a count of all of the active logic "1"s on each of lines $430_1$, $430_2$, ..., $430_N$ of bus 466 during each clock cycle and to provide the logic "1"s count to summation block 450 via bus 472. For example, if N is 20, and, in a given cycle, all bits of bus 460 are logic "1"s and thirteen of the bits of bus 466 are logic "1"s (and therefore seven of the bits of bus 466 are logic "0"s), the count ones block 448 can output a value of 13 to summation block 450 and the count zeros block 446 can output a value of 7 to summation block 450.

Summation block 450 can be configured to add the logic "1"s count from count ones block 448 to a previously accumulated error value from error register 452 and subtract the logic "0"s count from count zeros block 446 from the resulting sum to determine a new accumulated error value, and store the new error value in error register 452, during each clock cycle via bus 473.

The accumulated error value in error register 452 can be a positive number, a negative number, or zero. In one embodiment, a positive error value can indicate that more logic "1"s have been counted than logic "0"s and a negative error value can indicate that more logic "0"s have been counted than logic "1"s on lines $430_1$, $430_2$, ..., $430_N$.

Decision block 456 can be configured to compare the error value from error accumulator 440 with a positive threshold value and to provide an override signal to override generator 454 if the new error value is greater than the positive threshold value. Decision block 458 can be configured to compare the new error value with a negative threshold value and to provide an override signal to override generator 454 if the new error value is greater than the negative threshold value. Override generator 454 can be configured to provide compensation data to an input of MUX 434 and to provide a select signal to the select input of MUX 434 so as to cause MUX 434 to output the compensation data if an override signal is received from either decision block 456 or decision block 458.

In an embodiment of the invention wherein the termination voltage is equal to approximately 50.0 percent of the supply voltage, the compensation data can include a higher proportion of logic "1"s or a higher proportion of logic "0"s as required to restore an overall balance between logic "1"s and logic "0"s on bus 310 (i.e. on lines $316_1$, $316_2$, ..., $316_N$)

(shown in FIG. 3). For example, if the new error value from error accumulator 440 indicates a deficiency of logic "1's", the compensation data can include a required number of logic "1's" so as to maintain an overall balance between logic "1's" and logic "0's" on bus 310, and vice versa. Restoring the balance between logic "1's" and logic "0's" on bus 310 can require providing compensation data on bus 310 during more than one idle cycle. By restoring an overall balance between logic "1's" and logic "0's" on bus 310, an embodiment of the invention is restoring a net average duty cycle of approximately 50.0 percent on the bits of bus 310 (i.e. on lines $316_1$, $316_2$, ..., $316_N$).

In one embodiment of the invention, the termination voltage can be equal to a fraction other than one-half of the difference between the supply voltage and ground (i.e. other than approximately 50.0 percent of the supply voltage). In that embodiment, the compensation data can include differing proportions of logic "1's" and logic "0's" as required to restore the desired ratio between logic "1's" and logic "0's" on bus 310 (i.e. on lines $316_1$, $316_2$, ..., $316_N$), as required to provide a desired termination voltage at capacitor node 324 (shown in FIG. 3). In another embodiment, the termination voltage can be equal to a fraction of the difference between a positive supply voltage and a negative supply voltage, which can be utilized in place of ground.

In one embodiment of the invention, one or more of lines $316_1$, $316_2$, ..., $316_N$ (shown in FIG. 3) can be tri-stated to save power when bus 310 is not being utilized (i.e. during an idle cycle). In that embodiment, a line that is tri-stated is being driven to either a logic "0" or to a logic "1", or it is not being driven. When the tri-stated line is not being driven, error accumulator 440 does not count the line as either a logic "0" or a logic "1". However, when virtual regulator 412 is providing compensation data on lines $316_1$, $316_2$, ..., $316_N$, it (i.e. virtual regulator 412) can override the tri-state condition on the tri-stated line or lines.

Thus, as discussed above, by utilizing a virtual regulator to provide a termination voltage for a plurality of lines, such as address/control lines, at a capacitor node in a termination circuit, the present invention provides a termination circuit that can provide a required termination voltage at a reduced manufacturing cost compared to conventional termination circuits. For example, by utilizing a virtual regulator to provide a termination voltage, the invention's termination circuit avoids the cost of a special linear regulator, as required in conventional termination circuit 100 in FIG. 1, and also avoids the cost of an additional termination resistor for each line, as required in conventional termination circuit 200 in FIG. 2. Also, by not drawing DC power through termination resistors, the invention's termination circuit also reduces power consumption compared to conventional termination circuit 200.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

The invention claimed is:

1. A termination circuit comprising:
a capacitor node;
a plurality of drivers configured to receive source data on an input bus and to drive an output bus comprising a plurality of output lines;
each of said plurality of output lines being coupled by a resistor between one of said plurality of output lines and said capacitor node;
a virtual regulator configured to control a termination voltage at said capacitor node by inputting compensation data into said plurality of drivers.

2. The termination circuit of claim 1, wherein said compensation data is inputted into said plurality of drivers during at least one idle cycle when an error value corresponding to a difference between a logic ones count and a logic zeros count on said input bus exceeds a threshold value.

3. The termination circuit of claim 2, wherein said virtual regulator is further configured to detect said at least one idle cycle by detecting an idle code in said source data.

4. The termination circuit of claim 3, wherein said compensation data includes a majority of logic ones if said error value indicates a deficiency of logic ones or a majority of logic zeros if said error value indicates a deficiency of logic zeros.

5. The termination circuit of claim 1 further comprising at least one capacitor coupled between said capacitor node and a ground.

6. The termination circuit of claim 1 further comprising at least one capacitor coupled between a negative supply voltage and a ground.

7. The termination circuit of claim 1, wherein said termination voltage is equal to a fraction of a supply voltage.

8. The termination circuit of claim 1, wherein said termination voltage is equal to approximately 50.0 percent of a supply voltage.

9. The termination circuit of claim 8, wherein said termination circuit is a DDR DRAM termination circuit.

10. The termination circuit of claim 1 further comprising a plurality of loads coupled to said output bus.

11. A virtual regulator for controlling a termination voltage in a termination circuit, said termination circuit including a plurality of drivers configured to receive source data on an input bus and to drive an output bus comprising a plurality of output lines each coupled through a resistor to a common capacitor node, said virtual regulator comprising:
an error accumulator configured to determine an error value corresponding to a difference between a logic ones count and a logic zeros count on said input bus;
an override block configured to control said termination voltage at said capacitor node.

12. The virtual regulator of claim 11, wherein said error value is determined by said error accumulator over a plurality of clock cycles.

13. The virtual regulator of claim 11, wherein said override block controls said termination voltage by causing compensation data to be inputted into said plurality of drivers during at least one idle cycle when said error value exceeds a threshold value.

14. The virtual regulator of claim 13 further comprising an idle detector configured to detect said at least one idle cycle by detecting an idle code in said source data.

15. The virtual regulator of claim 14, wherein said compensation data includes said idle code.

16. The virtual regulator of claim 13, wherein said compensation data includes a majority of logic ones if said error value indicates a deficiency of logic ones or a majority of logic zeros if said error value indicates a deficiency of logic zeros.

17. The virtual regulator of claim 13 further comprising a multiplexer for selecting between said source data and said compensation data.

18. The virtual regulator of claim 11, wherein said termination voltage is equal to a fraction of a supply voltage.

19. The virtual regulator of claim 11, wherein said termination circuit is a DDR DRAM termination circuit.

* * * * *